United States Patent
Zhou et al.

(10) Patent No.: US 10,497,724 B2
(45) Date of Patent: Dec. 3, 2019

(54) MANUFACTURING METHOD OF A THIN FILM TRANSISTOR AND MANUFACTURING METHOD OF AN ARRAY SUBSTRATE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Zhichao Zhou, Guangdong (CN); Hui Xia, Guangdong (CN); Meng Chen, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/010,714

(22) Filed: Jun. 18, 2018

(65) Prior Publication Data
US 2019/0206902 A1 Jul. 4, 2019

Related U.S. Application Data

(63) Continuation of application No. PCT/CN2018/073093, filed on Jan. 17, 2018.

(30) Foreign Application Priority Data

Dec. 28, 2017 (CN) .......................... 2017 1 1462216

(51) Int. Cl.
*H01L 21/00* (2006.01)
*H01L 27/12* (2006.01)
(Continued)

(52) U.S. Cl.
CPC ........ *H01L 27/127* (2013.01); *H01L 21/3065* (2013.01); *H01L 21/3086* (2013.01);
(Continued)

(58) Field of Classification Search
None
See application file for complete search history.

(56) References Cited

U.S. PATENT DOCUMENTS 6,884,664 B2 * 4/2005 Fujimoto ............ H01L 27/1214
438/149
2002/0025591 A1 * 2/2002 Ohnuma ........... H01L 21/28114
438/30

(Continued)

FOREIGN PATENT DOCUMENTS

| CN | 203521409 U | 4/2014 |
| CN | 106684037 A | 5/2017 |
| CN | 107369715 A | 11/2017 |

*Primary Examiner* — Evren Seven
(74) *Attorney, Agent, or Firm* — Hemisphere Law, PLLC; Zhigang Ma

(57) ABSTRACT

The disclosure provides a manufacturing method for a thin film transistor, wherein a manufacturing method for a data line and a source/drain specifically includes: S21: respectively manufacturing a data line material film layer and a source/drain material film layer; S22: manufacturing a photoresist material film layer; S23: performing a half-tone method to etch the photoresist material film layer, forming a photoresist layer, and obtaining a first etching substrate; S24: performing a 4-mask process to etch the first substrate, forming the data line on a gate insulating layer, forming the source and the drain on an active layer, and forming a the back channel between the source and the drain to obtain the thin film transistor. The disclosure further provides a manufacturing method for an array substrate, wherein the manufacturing method for an array substrate includes the above-mentioned manufacturing method for a thin film transistor.

20 Claims, 6 Drawing Sheets

(51) Int. Cl.
  *H01L 29/66*     (2006.01)
  *H01L 21/3065*   (2006.01)
  *H01L 21/306*    (2006.01)
  *H01L 21/308*    (2006.01)

(52) U.S. Cl.
  CPC .... *H01L 21/30604* (2013.01); *H01L 27/1288* (2013.01); *H01L 29/66765* (2013.01)

(56) References Cited

U.S. PATENT DOCUMENTS

| | | | |
|---|---|---|---|
| 2007/0001225 A1* | 1/2007 | Ohnuma | H01L 27/1214 257/347 |
| 2007/0037069 A1* | 2/2007 | Ohnuma | G03F 1/32 430/5 |
| 2013/0292768 A1 | 11/2013 | Cho et al. | |
| 2016/0300852 A1* | 10/2016 | Park | H01L 27/124 |
| 2018/0252952 A1* | 9/2018 | Li | H01L 27/124 |
| 2019/0103419 A1* | 4/2019 | Wang | H01L 27/1218 |
| 2019/0103421 A1* | 4/2019 | Kikuchi | H01L 27/1225 |
| 2019/0115374 A1* | 4/2019 | Wu | H01L 27/1288 |

* cited by examiner

MANUFACTURING METHOD OF A THIN FILM TRANSISTOR AND MANUFACTURING METHOD OF AN ARRAY SUBSTRATE

RELATED APPLICATIONS

The application is a continuation application of PCT Patent Application No. PCT/CN2018/073093, filed Jan. 17, 2018, which claims the priority benefit of Chinese Patent Application No. 201711462216.X, filed Dec. 28, 2017, which is herein incorporated by reference in its entirety.

FIELD OF THE DISCLOSURE

The disclosure relates to a liquid crystal display manufacturing technical field, and more particularly to a manufacturing method of a thin film transistor, and a manufacturing method of an array substrate based on the manufacturing method of a thin film transistor.

BACKGROUND

Copper process is a commonly used technology for the current large-size LCD panel products, and usually with 4-mask process to reduce the cost of the array process. However, with the use of 4-mask process, the side surface of the copper will be exposed to the dry etching gas under the process, then the copper compounds are formed to affect the next etching process, and the abnormal taper angle and the serrate data lines are formed to affect the step coverage.

Specifically, the 4 Mask process in the prior art is generally as follows: first wet etching, then dry etching, wet etching again, and last dry etching to obtain the data line and the source/drain. A structural schematic view of a pattern after the first wet etching is as shown in FIG. 1; a structural schematic view of a pattern after the first dry etching is as shown in FIG. 2 and a scanning electron microscope (SEM) diagram is as shown in FIG. 3, the sidewall of copper reacts with gas such as $SF_6/Cl_2$ in dry etching to form a copper compound layer 1b; a structural schematic view of a pattern after the second wet etching is as shown in FIG. 4 and a scanning electron microscope (SEM) diagram is as shown in FIG. 5, the existence of the copper compound layer formed above will greatly affect the wet etching of the copper in the next step and finally form a jagged edge; a structural schematic view of a pattern after the second dry etching is as shown in FIG. 6. In FIG. 1, FIG. 2, FIG. 4 and FIG. 6, 11 denotes a base, 12 denotes a gate, 13 denotes a gate insulating layer, 14 denotes an active layer, 15a denotes a data line precursor, 15 denotes a data line, 16a Denotes a source/drain precursor, 161 denotes a source, 162 denotes a drain, 163 denotes a channel formed between the source 161 and the drain 162, 1a denotes a photoresist.

In summary, due to the limitations of the current 4-mask process, the step coverage and yield are greatly affected.

SUMMARY

A technical problem to be solved by the disclosure is to provide a manufacturing method of a thin film transistor, a data line material film layer and a source/drain material film layer with a lager width are designed and a photoresist layer is formed by using a halftone mask method in the manufacturing method of a thin film transistor, the jagged edge due to dry etching during the formation of data line and source/drain could be avoided.

To achieve the above object, according to one aspect, the embodiment of the disclosure provides a manufacturing method of a thin film transistor, including the following steps:

S1: sequentially manufacturing a gate, a gate insulating layer and an active layer on a base; and S2: manufacturing a data line on the gate insulating layer, manufacturing a source and a drain on the active layer, etching the active layer between the source and the drain to form a back channel, and obtaining a thin film transistor;

wherein a specific method of the step S2 includes the following steps:

S21: manufacturing a data line material film layer on the gate insulating layer, manufacturing a source/drain material film layer on the active layer;

S22: manufacturing a photoresist material film layer on the data line material film layer and the source/drain material film layer;

S23: performing a half-tone mask method to etch the photoresist material film layer, forming a photoresist layer, and obtaining a first etching substrate;

wherein a thickness of an edge of the photoresist layer on the data line material film layer is smaller than a thickness of a center of the photoresist layer on the data line material film layer, a width of the center of the photoresist layer on the data line material film layer is equal to a width of a pre-formed data line, a thickness of an edge of the photoresist layer on the source/drain material film layer and a thickness of a center of the photoresist layer on the source/drain material film layer are smaller than a thickness between the edge of the photoresist layer on the source/drain material film layer and the center of the photoresist layer on the source/drain material film layer, and a width from the center of the photoresist layer on the source/drain material film layer extending to the edge of the photoresist layer on the source/drain material film layer is equal to a width of an edge spacing between a pre-formed source and a pre-formed drain; and S24: performing a 4-mask process to etch the first substrate, forming the data line on the gate insulating layer, forming the source and the drain on the active layer, and forming the back channel between the source and the drain to obtain the thin film transistor.

Furthermore, in the step S23, the width of the center of the photoresist layer on the data line material film layer is smaller than a width of the data line material film layer, and the width from the center of the photoresist layer on the source/drain material film layer extending to the edge of the photoresist layer on the source/drain material film layer is smaller than a width of the source/drain material film layer.

Furthermore, a specific method of the step S24 is:

sequentially performing a first wet etching and a first dry etching on the first etching substrate, wherein a surface of the data line material film layer and a surface of the source/drain material film layer form a copper compound layer to obtain a second etching substrate;

sequentially performing a first photoresist ashing and a second wet etching to form the data line on the gate insulating layer and the source and the drain on the active layer, and obtaining a third etching substrate; and sequentially performing a second dry etching and a second photoresist ashing to completely remove the photoresist layer, and forming the back channel between the source and the drain to obtain the thin film transistor.

Furthermore, in the first wet etching and the second wet etching, an etching solution is cupric acid.

Furthermore, in the first dry etching and the second dry etching, an etching gas is $SF_6/Cl_2$.

Furthermore, in the first photoresist ashing and the second photoresist ashing, an ashing gas is $O_2$.

To achieve the above object, according to another aspect, the embodiment of the disclosure provides a manufacturing method of an array substrate, at least including the above-mentioned manufacturing method of a thin film transistor.

The data line material film layer and the source/drain material film layer with a lager width are designed and the photoresist layer is formed by using a halftone mask method in the disclosure. Therefore, the copper compound layer formed on the surface of the copper film (the data line material film layer and the source/drain film material layer) by a dry etching will not affect the shape of the data line and the source/drain when performing the 4-mask process, the jagged edge of data line and source/drain in the prior art could be avoided to improve the foreign matter of the side of the copper data line and the source/drain and form the normal taper angle, so the step coverage could be improved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. In the figures.

DETAILED DESCRIPTION OF PREFERRED EMBODIMENTS

The following description with reference to the accompanying drawings is provided to explain the exemplary embodiments of the disclosure. It will be apparent, however, that the disclosure may be practiced by one or more embodiments, and the specific embodiments provided herein cannot be interpreted to limit the disclosure. On the contrary, those embodiments are provided to explain the principle and the application of the disclosure such that those skilled in the art may understand the various embodiments of the disclosure and the various modifications for specific expected application. For illustrating clearly, the size and the dimension of an element can be enlarged, and an element using the same reference number always represents for the same or similar element.

It will be understood that although the terms "first" and "second" are used herein to describe various elements, these elements should not be limited by these terms. Terms are only used to distinguish one element from other elements.

Embodiment 1

Figure 1:
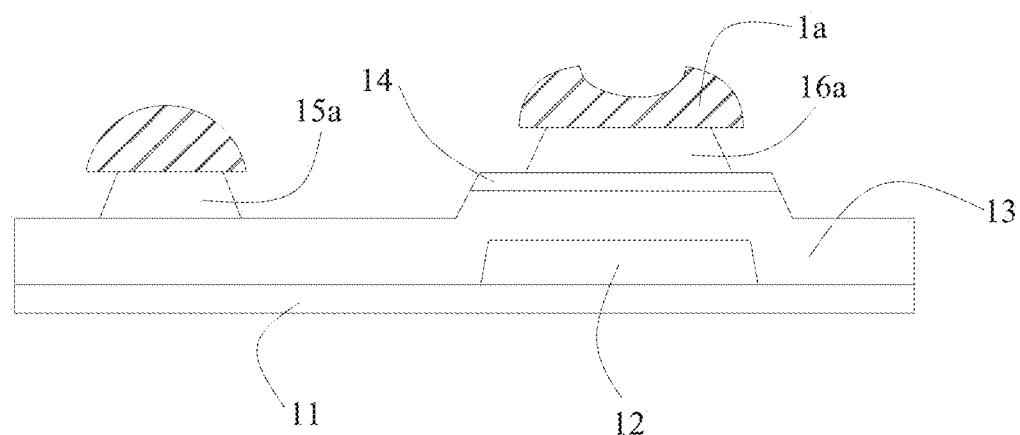
FIG. 1 is a structural schematic view of a pattern after a first wet etching in a 4-mask process of the prior art.
Figure 2:
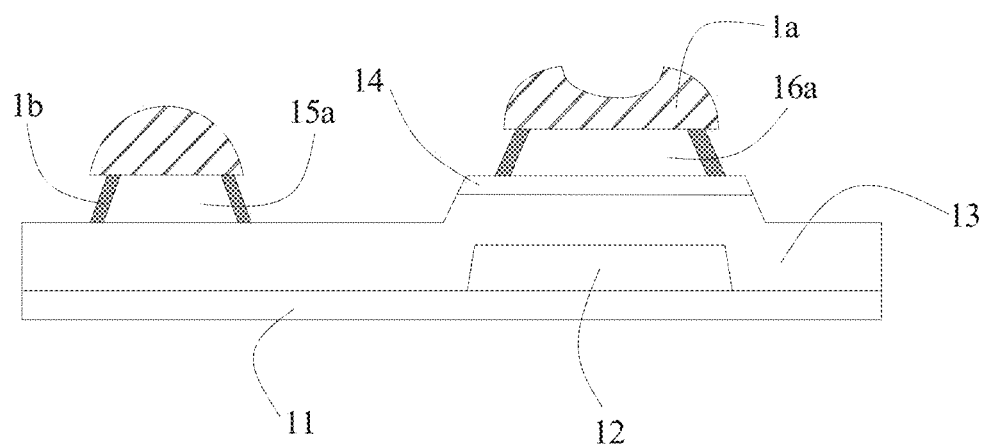
FIG. 2 is a structural schematic view of a pattern after a first dry etching in a 4-mask process of the prior art.
Figure 3:
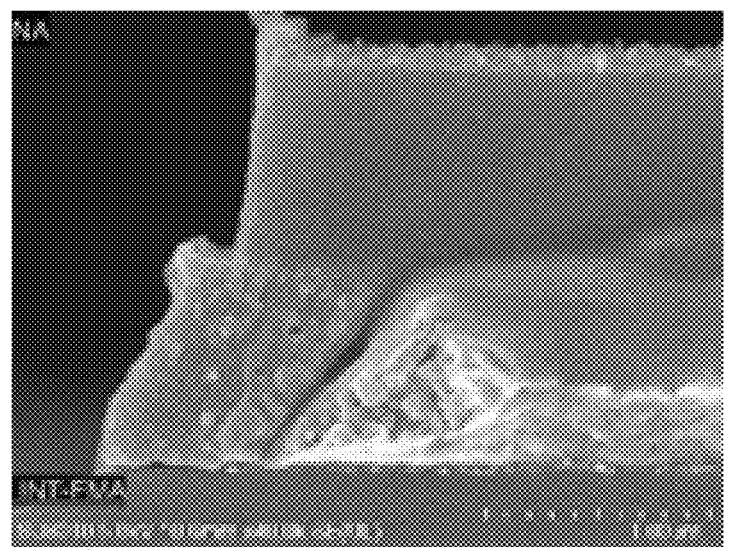
FIG. 3 is a scanning electron microscope (SEM) diagram of a pattern after a first dry etching in a 4-mask process of the prior art.
Figure 4:
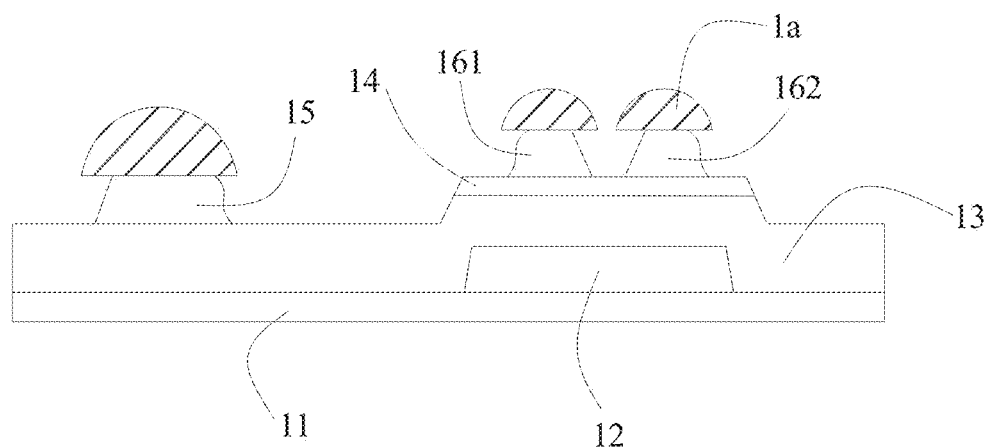
FIG. 4 is a structural schematic view of a pattern after a second wet etching in a 4-mask process of the prior art.
Figure 5:
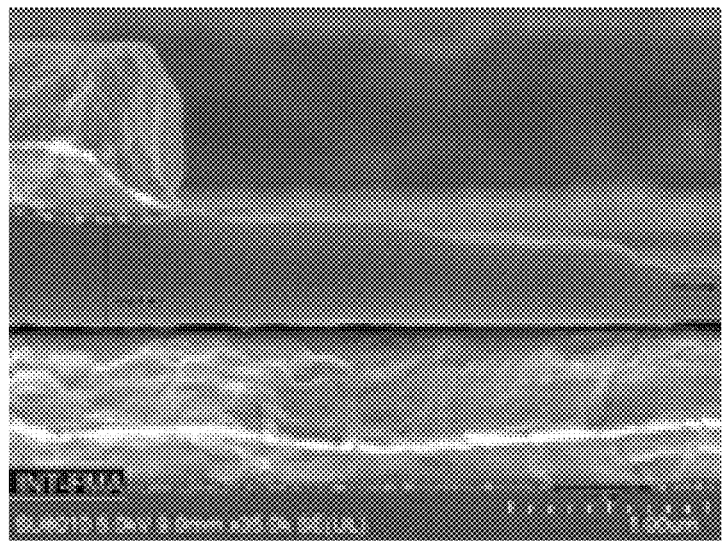
FIG. 5 is a scanning electron microscope (SEM) diagram of a pattern after a second wet etching in a 4-mask process of the prior art.
Figure 6:
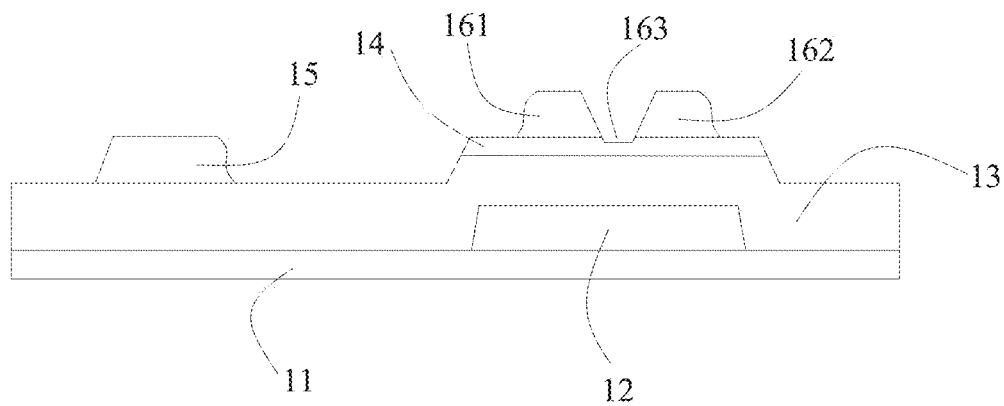
FIG. 6 is a structural schematic view of a pattern after a second dry etching in a 4-mask process of the prior art.
Figure 7:
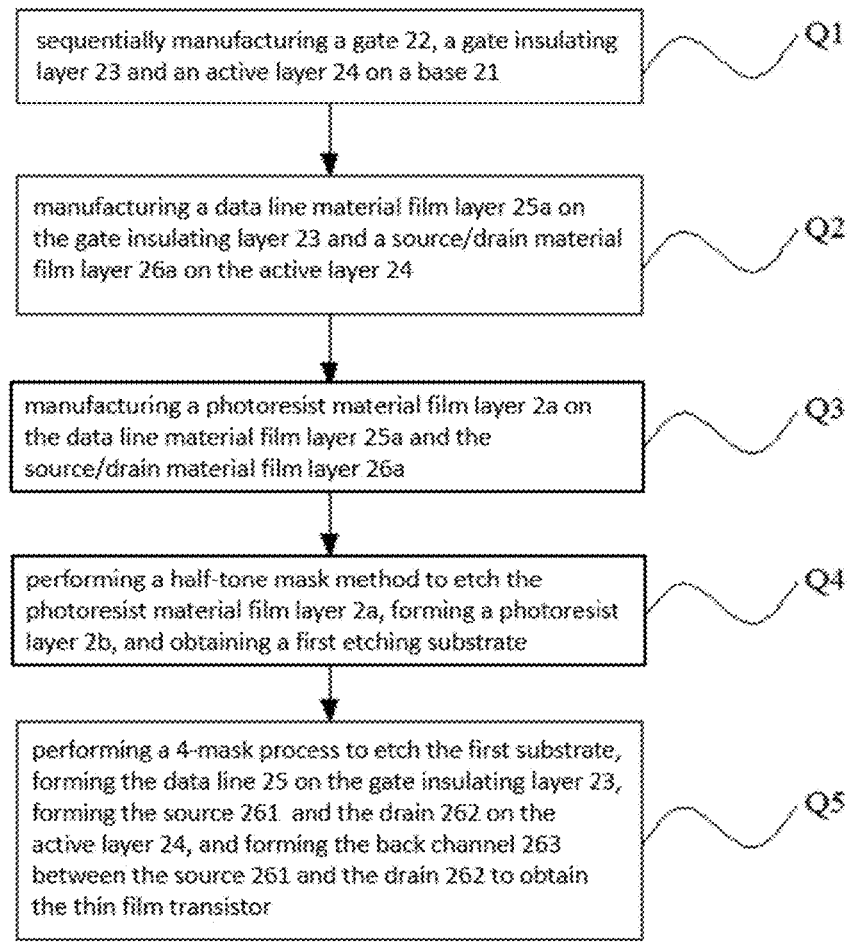
FIG. 7 is a flow chart diagram of a manufacturing method of a thin film transistor according to Embodiment 1 of the disclosure.

FIG. 7 is a flow chart diagram of a manufacturing method of a thin film transistor according to Embodiment 1 of the disclosure.

Figure 8:
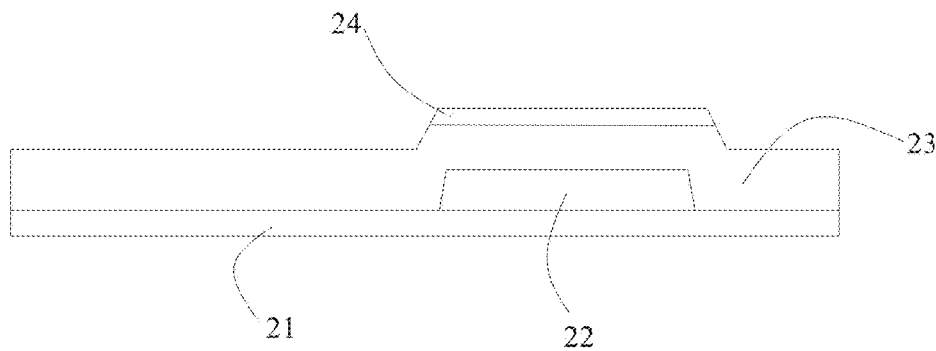
FIG. 8 to FIG. 16 are process flow diagrams of a manufacturing method of a thin film transistor according to Embodiment 1 of the disclosure.

Specifically refer to FIG. 7, the manufacturing method of a thin film transistor according to this embodiment includes the following steps:

In the step Q1, sequentially manufacturing a gate 22, a gate insulating layer 23 and an active layer 24 on a base 21 is as shown in FIG. 8.

The selection of the base 21, the material selection and the process for fabricating the gate 22, the gate insulating layer 23 and the active layer 24 thereon will not be described herein. Those skilled in the art can refer to the prior art.

For example, a glass base can be used as the base 21, the material of the gate 22 may be a Mo/Cu multilayer material or a Ti/Mo/Cu multilayer material, the material of the gate insulating layer 23 may be $SiN_x$. Selectively, if the material of the gate 22 is a Mo/Cu multilayer, the Mo layer has a thickness of 100 Å~300 Å and the Cu layer has a thickness of 3000 Å~6000 Å. Meanwhile, a thickness of the gate insulating layer 23 is 2000 Å~5000 Å. In general, the gate 22 could be formed by a coating/exposure/development/wet etching/lift-off process.

The active layer 24 is generally obtained by depositing a layer of amorphous silicon and doped amorphous silicon with a thickness of 1300 Å~2000 Å on the gate insulating layer 23 by a PECVD method.

Figure 9:
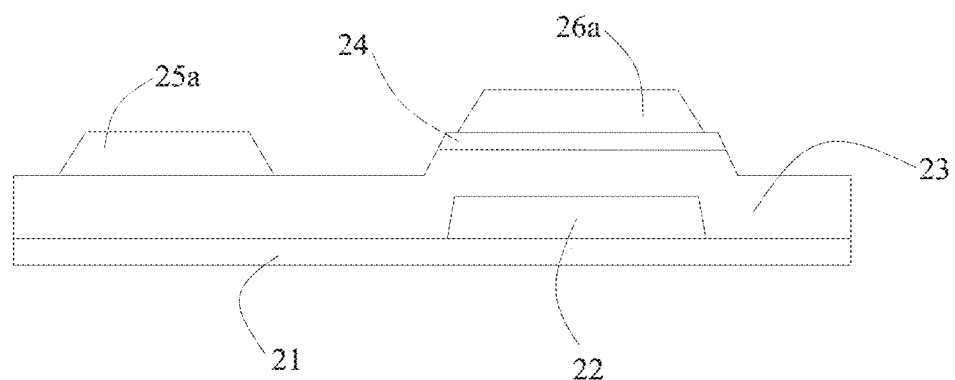

In the step Q2, manufacturing a data line material film layer 25a on the gate insulating layer 23, manufacturing a source/drain material film layer 26a on the active layer 24 are as shown in FIG. 9.

In general, the data line material film layer 25a and the source/drain material film layer 26a may be integrally formed. Therefore, a layer of Mo/Cu multilayer material or Ti/Mo/Cu multilayer material is obtained by physical sputtering, the data line material film layer 25a is correspondingly formed on the gate insulating layer 23, and the source/drain material film layer 26a is correspondingly formed on the active layer 24.

Selectively, if the material of the data line material film layer 25a and the source/drain material film layer 26a is a Mo/Cu multilayer material, the Mo layer has a thickness of 100 Å~300 Å, and the Cu layer has a thickness of 3000 Å~6000 Å.

Figure 10:
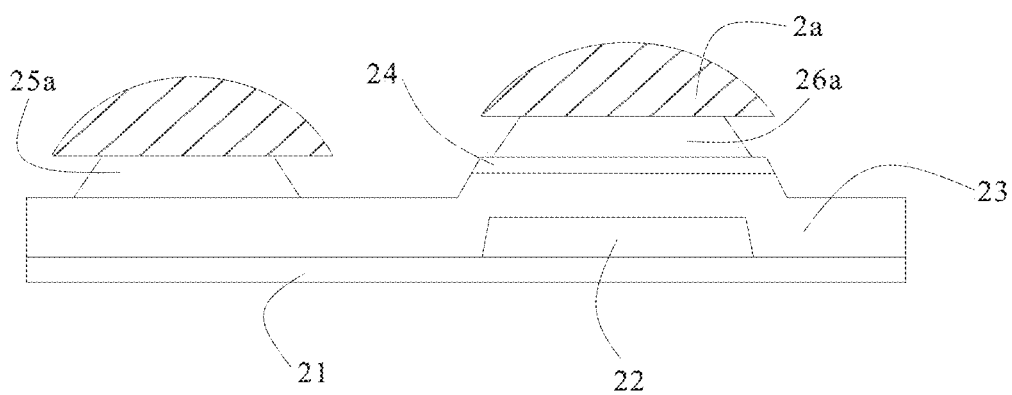

In the step Q3, manufacturing a photoresist material film layer 2a on the data line material film layer 25a and the source/drain material film layer 26a is as shown in FIG. 10.

The material of the photoresist material film layer 2a may be a negative photoresist, hereinafter referred to as PR glue.

Figure 11:
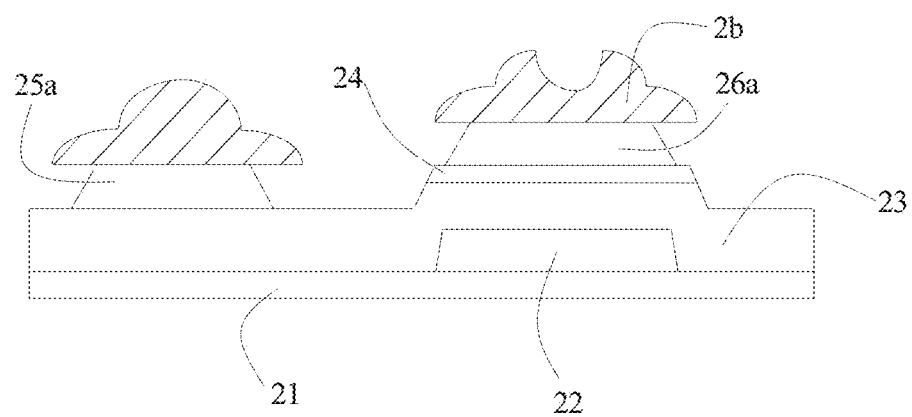

In the step Q4, performing a half-tone mask method to etch the photoresist material film layer 2a, forming a photoresist layer 2b, and obtaining a first etching substrate, is as shown in FIG. 11.

Specifically, the photoresist layer 2b as shown in FIG. 11 is obtained by the halftone mask method in combination with a coating/exposure/development process. Specifically refer to FIG. 12, a thickness of an edge of the photoresist layer 2b on the data line material film layer 25a is smaller than a thickness of a center of the photoresist layer 2b on the data line material film layer 25a, a width L1 of the center of the photoresist layer 2b on the data line material film layer 25a is equal to a width of a pre-formed data line, a thickness of an edge of the photoresist layer 2b on the source/drain material film layer 26a and a thickness of a center of the photoresist layer 2b on the source/drain material film layer 26a are smaller than a thickness between the edge of the photoresist layer 2b on the source/drain material film layer 26a and the center of the photoresist layer 2b on the source/drain material film layer 26a, and a width L3 from the center of the photoresist layer 2b on the source/drain material film layer 26a extending to the edge of the photoresist layer 2b on the source/drain material film layer 26a is equal to a width of an edge spacing between a pre-formed source and a pre-formed drain.

Figure 12:
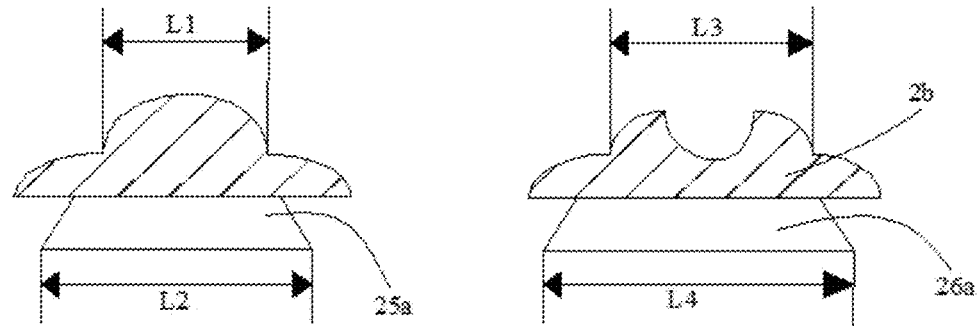

As shown in FIG. 12, the edge of the photoresist layer 2b on the data line material film layer 25a refers to the thinner portion of the photoresist layer 2b, the center of the photoresist layer 2b on the data line material film layer 25a refers to the thicker portion of the photoresist layer 2b, the edge of the photoresist layer 2b on the source/drain material film layer 26a refers to the thinner outside portion of the photoresist layer 2b, the center of the photoresist layer 2b on the source/drain material film layer 26a refers to the thinner portion in the middle recess of the photoresist layer 2b, and the portion between the edge of the photoresist layer 2b on the source/drain material film layer 26a and the center of the photoresist layer 2b on the source/drain material film layer 26a refers to the thicker portion in the protrusion of the photoresist layer 2b between the edge and the center.

Selectively, in order to get a better etching effect, the width L1 of the center of the photoresist layer 2b on the data line material film layer 25a is smaller than a width L2 of the data line material film layer 25a, and the width L3 from the center of the photoresist layer 2b on the source/drain material film layer 26a extending to the edge of the photoresist layer 2b on the source/drain material film layer 26a is smaller than a width L4 of the source/drain material film layer 26a.

In the step Q5, perform a 4-mask process to etch the first substrate, forming the data line 25 on the gate insulating layer 23, form the source 261 and the drain 261 on the active layer 24, and form the back channel 261 between the source 261 and the drain 262 to obtain the thin film transistor.

Figure 13:
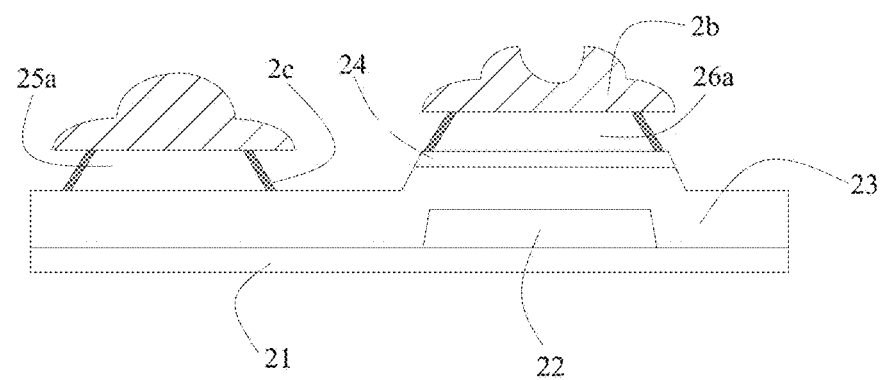

Specifically, the 4-mask process is: first, sequentially performing a first wet etching and a first dry etching on the first etching substrate, wherein a surface of the data line material film layer 25a and a surface of the source/drain material film layer 26a form a copper compound layer 2c to obtain a second etching substrate, as shown in FIG. 13.

The surface refers to the surface of the data line material film layer 25a and the source/drain material film layer 26a that is not covered by the photoresist layer 2b, that is, the sidewall of the data line material film layer 25a and the source/drain material film layer 26a.

Figure 14:
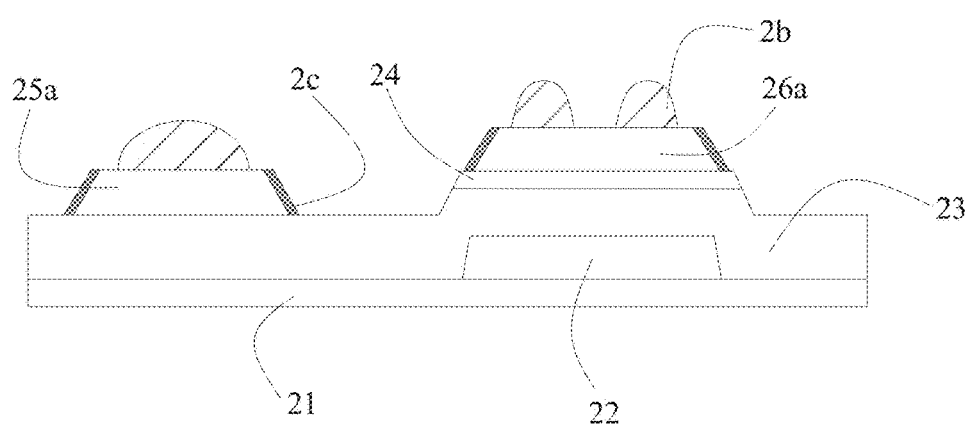
Figure 15:
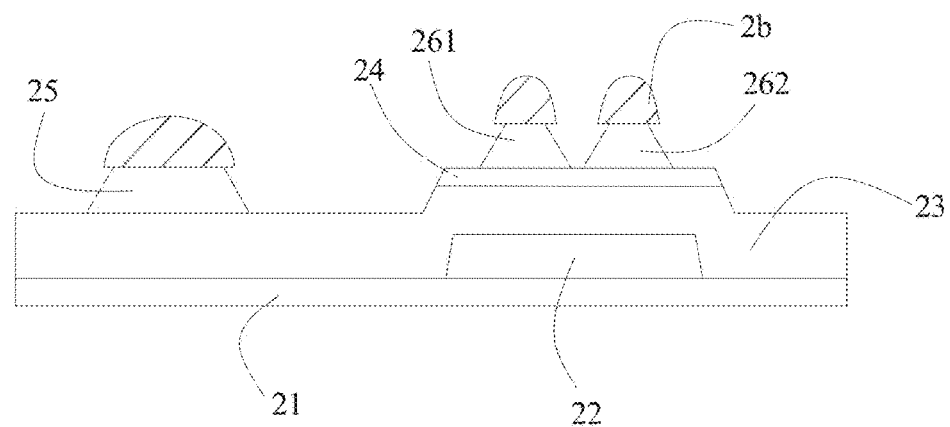

Then, sequentially performing a first photoresist ashing and a second wet etching to form the data line 25 on the gate insulating layer 23 and the source 261 and the drain 261 on the active layer 24, and obtaining a third etching substrate, as shown in FIG. 14 and FIG. 15.

Due to the special shape of the photoresist layer 2b, the edge of the photoresist layer 2b on the data line material film layer 25a with the thinner thickness could be removed while keeping the center of the photoresist layer 2b on the data line material film layer 25a with the thicker thickness, the edge and the center of the photoresist layer 2b on the source/drain material film layer 26a could be removed while keeping the portion with a thicker thickness between the edge and the center.

Figure 16:
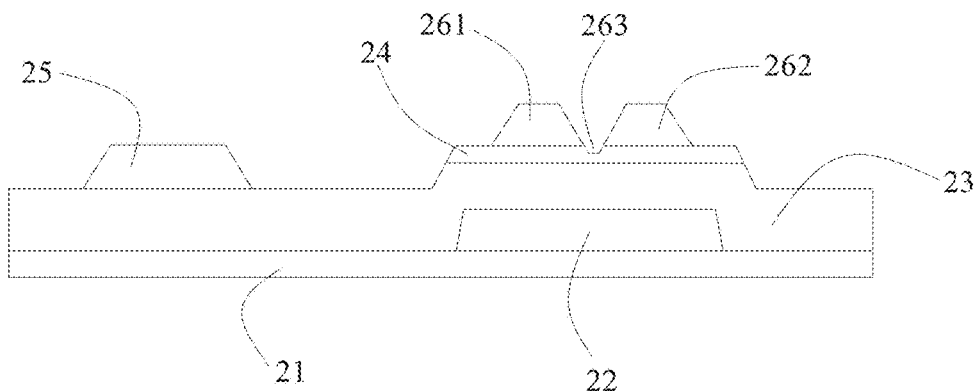

At last, sequentially performing a second dry etching and a second photoresist ashing to completely remove the photoresist layer 2b, and forming the back channel 263 between the source 261 and the drain 262 to obtain the thin film transistor, as shown in FIG. 16.

In the first wet etching and the second wet etching, an etching solution is cupric acid. In the first dry etching and the second dry etching, an etching gas is $SF_6/Cl_2$. In the first photoresist ashing and the second photoresist ashing, an ashing gas is $O_2$. The process parameters involved in the above-mentioned 4-mask process are not described herein, and those skilled in the art can refer to the prior art.

In this way, the data line material film layer 25a and the source/drain material film layer 26a with a lager width are designed and the photoresist layer 2b is formed by using a halftone mask method in this embodiment. Therefore, the copper compound layer formed on the surface of the copper film (the data line material film layer 25a and the source/drain film material layer 26a) by a dry etching will not affect the shape of the data line 25 and the source/drain 26 when performing the 4-mask process, the jagged edge of data line 25 and source/drain 26 in the prior art could be avoided to improve the foreign matter of the side of the data line 25 and the source/drain 26 made of copper and form the normal taper angle, so the step coverage could be improved.

Embodiment 2

This embodiment provides a manufacturing method of an array substrate, including manufacturing the thin film transistor and manufacturing the elements connected to the thin film transistor such as pixel electrode, wherein, the manufacturing method of the thin film transistor is as described in Embodiment 1, the method for fabricating other elements than the thin film transistor could refer to the prior art, which is not described herein. For example, a passivation layer is firstly formed on the thin film transistor, then a via structure is formed on the passivation layer, and a transparent conductive material such as ITO is deposited by physical sputtering to form a pixel electrode or the like.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A manufacturing method for a thin film transistor, comprising:
    S1: sequentially manufacturing a gate, a gate insulating layer and an active layer on a base; and
    S2: manufacturing a data line on the gate insulating layer, manufacturing a source and a drain on the active layer, etching the active layer between the source and the drain to form a back channel, and obtaining a thin film transistor;
    wherein a specific method of the step S2 comprises the following steps:
        S21: manufacturing a data line material film layer on the gate insulating layer, manufacturing a source/drain material film layer on the active layer;
        S22: manufacturing a photoresist material film layer on the data line material film layer and the source/drain material film layer;

S23: performing a 4-mask process to etch the photoresist material layer, wherein the 4 mask process comprises:
1) performing a half-tone mask method to etch the photoresist material film layer, thereby forming a photoresist layer, configured as a first etching substrate; wherein a thickness of an edge of the photoresist layer on the data line material film layer is smaller than a thickness of a center of the photoresist layer on the data line material film layer, a width of the center of the photoresist layer on the data line material film layer is equal to a width of a pre-formed data line, a thickness of an edge of the photoresist layer on the source/drain material film layer and a thickness of a center of the photoresist layer on the source/drain material film layer are smaller than a thickness between the edge of the photoresist layer on the source/drain material film layer and the center of the photoresist layer on the source/drain material film layer, and a width from the center of the photoresist layer on the source/drain material film layer extending to the edge of the photoresist layer on the source/drain material film layer is equal to a width of an edge spacing between a pre-formed source and a pre-formed drain;
2) a first wet etch and a first dry etch, thereby forming a compound layer on the side surfaces of the data line and source/drain material film, the compound layers configured as a second etching substrate;
3) a first ashing process and a second wet etch on the photoresist material to partially remove the photoresist layer, the remaining photoresist layer configured as a third etching substrate; and
4) a second ashing process and a second dry etch to pattern the data line and the source/drain material film and to remove the photoresist layer.

2. The manufacturing method for a thin film transistor according to claim 1, wherein in the step S23, the width of the center of the photoresist layer on the data line material film layer is smaller than a width of the data line material film layer, and the width from the center of the photoresist layer on the source/drain material film layer extending to the edge of the photoresist layer on the source/drain material film layer is smaller than a width of the source/drain material film layer.

3. The manufacturing method for a thin film transistor according to claim 1, wherein a specific method of the step S23 is:
sequentially performing the first wet etch and the first dry etch on the first etching substrate, wherein a surface of the data line material film layer and a surface of the source/drain material film layer form a copper compound layer to obtain a second etching substrate;
sequentially performing the first ashing process and a second wet etch to form the data line on the gate insulating layer and the source and the drain on the active layer, and obtaining a third etching substrate; and
sequentially performing the second dry etch and the second ashing process to completely remove the photoresist layer, and forming the back channel between the source and the drain to obtain the thin film transistor.

4. The manufacturing method for a thin film transistor according to claim 3, wherein in the first wet etching and the second wet etching, an etching solution is cupric acid.

5. The manufacturing method for a thin film transistor according to claim 3, wherein in the first dry etching and the second dry etching, an etching gas is $SF_6/Cl_2$.

6. The manufacturing method for a thin film transistor according to claim 3, wherein in the first photoresist ashing and the second photoresist ashing, an ashing gas is $O_2$.

7. The manufacturing method for a thin film transistor according to claim 2, wherein a specific method of the step S23 is:
sequentially performing the first wet etch and the first dry etch on the first etching substrate, wherein a surface of the data line material film layer and a surface of the source/drain material film layer form a copper compound layer to obtain a second etching substrate;
sequentially performing the first ashing process and a second wet etch to form the data line on the gate insulating layer and the source and the drain on the active layer, and obtaining a third etching substrate; and
sequentially performing the second dry etch and the second ashing process to completely remove the photoresist layer, and forming the back channel between the source and the drain to obtain the thin film transistor.

8. The manufacturing method for a thin film transistor according to claim 7, wherein in the first wet etching and the second wet etching, an etching solution is cupric acid.

9. The manufacturing method for a thin film transistor according to claim 7, wherein in the first dry etching and the second dry etching, an etching gas is $SF_6/Cl_2$.

10. The manufacturing method for a thin film transistor according to claim 7, wherein in the first photoresist ashing and the second photoresist ashing, an ashing gas is $O_2$.

11. A manufacturing method for an array substrate, wherein at least comprises a manufacturing method for a thin film transistor; wherein the manufacturing method for a thin film transistor comprises the following steps:
Q1: sequentially manufacturing a gate, a gate insulating layer and an active layer on a base; and
Q2: manufacturing a data line on the gate insulating layer, manufacturing a source and a drain on the active layer, etching the active layer between the source and the drain to form a back channel, and obtaining a thin film transistor;
wherein a specific method of the step Q2 comprises the following steps:
Q21: manufacturing a data line material film layer on the gate insulating layer, manufacturing a source/drain material film layer on the active layer;
Q22: manufacturing a photoresist material film layer on the data line material film layer and the source/drain material film layer;
Q23: performing a 4-mask process to etch the photoresist material layer, wherein the 4 mask process comprises:
1) performing a half-tone mask method to etch the photoresist material film layer, thereby forming a photoresist layer configured as a first etching substrate;
wherein a thickness of an edge of the photoresist layer on the data line material film layer is smaller than a thickness of a center of the photoresist layer on the data line material film layer, a width of the center of the photoresist layer on the data line material film layer is equal to a width of a pre-formed data line, a thickness of an edge of the photoresist layer on the source/drain material film layer and a thickness of a center of the photoresist layer on the source/drain material film layer are smaller than a thickness between the edge of the photoresist layer on the source/drain material film layer and the center of the photoresist layer on the source/drain material film layer, and a width from the center of the photoresist layer on the source/drain material film layer extending to the edge of the photoresist layer on the source/drain material film layer is equal to a width of an edge spacing between a pre-formed source and a pre-formed drain;

2) a first wet etch and a first dry etch, thereby forming a compound layer on the side surfaces of the data line and source/drain material film, the compound layers configured as a second etching substrate;

3) a first ashing process and a second wet etch on the photoresist material to partially remove the photoresist layer, the remaining photoresist layer configured as a third etching substrate; and 4) a second ashing process and a second dry etch to pattern the data line and the source/drain material film and to remove the photoresist layer.

12. The manufacturing method for an array substrate according to claim 11, wherein in the step Q23, the width of the center of the photoresist layer on the data line material film layer is smaller than a width of the data line material film layer, and the width from the center of the photoresist layer on the source/drain material film layer extending to the edge of the photoresist layer on the source/drain material film layer is smaller than a width of the source/drain material film layer.

13. The manufacturing method for an array substrate according to claim 11, wherein a specific method of the step Q23 is:

sequentially performing the first wet etch and the first dry etch on the first etching substrate, wherein a surface of the data line material film layer and a surface of the source/drain material film layer form a copper compound layer to obtain a second etching substrate;

sequentially performing the first ashing process and a second wet etch to form the data line on the gate insulating layer and the source and the drain on the active layer, and obtaining a third etching substrate; and sequentially performing the second dry etch and the second ashing process to completely remove the photoresist layer, and forming the back channel between the source and the drain to obtain the thin film transistor.

14. The manufacturing method for an array substrate according to claim 13, wherein in the first wet etching and the second wet etching, an etching solution is cupric acid.

15. The manufacturing method for an array substrate according to claim 13, wherein in the first dry etching and the second dry etching, an etching gas is $SF_6/Cl_2$.

16. The manufacturing method for an array substrate according to claim 13, wherein in the first photoresist ashing and the second photoresist ashing, an ashing gas is $O_2$.

17. The manufacturing method for an array substrate according to claim 12, wherein a specific method of the step Q23 is:

sequentially performing the first wet etch and the first dry etch on the first etching substrate, wherein a surface of the data line material film layer and a surface of the source/drain material film layer form a copper compound layer to obtain a second etching substrate;

sequentially performing the first ashing process and a second wet etch to form the data line on the gate insulating layer and the source and the drain on the active layer, and obtaining a third etching substrate; and sequentially performing the second dry etch and the second ashing process to completely remove the photoresist layer, and forming the back channel between the source and the drain to obtain the thin film transistor.

18. The manufacturing method for an array substrate according to claim 17, wherein in the first wet etching and the second wet etching, an etching solution is cupric acid.

19. The manufacturing method for an array substrate according to claim 17, wherein in the first dry etching and the second dry etching, an etching gas is $SF_6/Cl_2$.

20. The manufacturing method for an array substrate according to claim 17, wherein in the first photoresist ashing and the second photoresist ashing, an ashing gas is $O_2$.

* * * * *